(12) United States Patent
Helm et al.

(10) Patent No.: US 9,847,765 B1
(45) Date of Patent: Dec. 19, 2017

(54) AMPLIFIER WITH AUTOMATIC GAIN CONTROL

(71) Applicant: RAYTHEON COMPANY, Waltham, MA (US)

(72) Inventors: Brian P. Helm, Murphy, TX (US); Brian L. Dillaman, Frisco, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/238,654

(22) Filed: Aug. 16, 2016

(51) Int. Cl.
*H03G 3/30* (2006.01)
*H03F 3/193* (2006.01)

(52) U.S. Cl.
CPC ........... *H03G 3/3036* (2013.01); *H03F 3/193* (2013.01); *H03F 2200/294* (2013.01); *H03F 2200/318* (2013.01); *H03F 2200/465* (2013.01)

(58) Field of Classification Search
CPC .................................................. H03F 3/2176
USPC ......................................... 330/98, 150, 310
See application file for complete search history.

(56) References Cited

U.S. PATENT DOCUMENTS

| | | | |
|---|---|---|---|
| 5,047,731 A | 9/1991 | Lee | |
| 5,051,705 A | 9/1991 | Moghe et al. | |
| 5,493,255 A * | 2/1996 | Murtojarvi | H03F 1/0261 330/296 |
| 6,278,328 B1 * | 8/2001 | Yamamoto | H03F 1/52 330/207 P |
| 6,630,861 B2 * | 10/2003 | Kawaoka | H03G 1/007 330/133 |
| 6,882,226 B2 | 4/2005 | Cho et al. | |
| 6,906,595 B2 | 6/2005 | Kim et al. | |
| 6,970,038 B2 | 11/2005 | Chandrasekaran | |
| 7,495,514 B2 * | 2/2009 | Huang | H03F 1/26 330/260 |
| 8,456,237 B2 | 6/2013 | Huang et al. | |
| 2004/0104775 A1 * | 6/2004 | Seremeta | H03F 1/22 330/310 |
| 2005/0225390 A1 | 10/2005 | Klein et al. | |
| 2015/0015339 A1 * | 1/2015 | Gorbachov | H03G 3/3042 330/291 |
| 2015/0091650 A1 | 4/2015 | Nobbe et al. | |

* cited by examiner

*Primary Examiner* — Henry Choe
(74) *Attorney, Agent, or Firm* — Lewis Roca Rothgerber Christie LLP

(57) ABSTRACT

A low noise amplifying system with adjustable gain. The low noise amplifier includes a plurality of gain stages, including a first stage and a last stage each having fixed gain, and an intermediate stage having adjustable gain. The intermediate stage is an inverting gain stage that includes a field effect transistor connected from the output to the input, to provide negative feedback, reducing the gain as a control voltage (applied to the gate of the field effect transistor) is adjusted to decrease the channel resistance of the field effect transistor. A control circuit measures the input and output signal power of the amplifying system and adjusts the gain of one or more intermediate stages to trade off linearity against noise figure.

17 Claims, 9 Drawing Sheets

AMPLIFIER WITH AUTOMATIC GAIN CONTROL

BACKGROUND

1. Field

One or more aspects of embodiments according to the present invention relate to amplifiers, and more particularly to a radio frequency or microwave amplifier with automatic gain control.

2. Description of Related Art

A receiver including an antenna and a low-noise amplifier may receive small or large amplitude signals at various times. If the gain of the receiver is selected to provide good performance when small amplitude signals are received, it may perform poorly, e.g., exhibit excessive compression, when large amplitude signals are received, and if the gain of the receiver is selected to provide good performance when large amplitude signals are received, it may perform poorly, e.g., exhibit excessive noise, when small amplitude signals are received.

Related art systems may include an attenuator for the purpose of reducing the gain when high signal amplitudes are present at the input of an amplifier; the use of an attenuator, however, may significantly degrade the noise performance of the system.

Thus, there is a need for an amplifier system that provides good performance for both small and large signals.

SUMMARY

Aspects of embodiments of the present disclosure are directed toward a low noise amplifying system with adjustable gain. The low noise amplifier includes a plurality of gain stages, including a first stage and a last stage each having fixed gain, and an intermediate stage having adjustable gain. The intermediate stage is an inverting gain stage that includes a field effect transistor connected from the output to the input, to provide negative feedback, reducing the gain as a control voltage (applied to the gate of the field effect transistor) is adjusted to decrease the channel resistance of the field effect transistor. A control circuit measures the input and output signal power of the amplifying system and adjusts the gain of one or more intermediate stages to trade off linearity against noise figure.

According to an embodiment of the present invention there is provided an amplifier having an input and an output, the amplifier including: a plurality of gain stages, connected in a cascade, the plurality of gain stages including: a first gain stage, being the first gain stage in the cascade, and including a first amplifying device, a second gain stage, being the last gain stage in the cascade, and including a second amplifying device, a third gain stage, including a third amplifying device; and a first gain control field effect transistor having a gate and a channel, a first end of the channel being a source of the first gain control field effect transistor, and a second end of the channel being a drain of the first gain control field effect transistor, the channel of the first gain control field effect transistor being operatively coupled across: an input terminal of the third amplifying device, and an output terminal of the third amplifying device.

In one embodiment, the amplifier includes: an input power detector connected to the input of the amplifier and configured to produce an input power signal indicating an amount of power of a signal propagating into the input of the amplifier; and an output power detector connected to the output of the amplifier and configured to produce an output power signal indicating an amount of power of a signal propagating out of the output of the amplifier.

In one embodiment, the amplifier includes a control circuit connected to: the input power detector, the output power detector, and the gate of the first gain control field effect transistor, the control circuit being configured to receive the input power signal and the output power signal and to control a gain of the third gain stage by providing a first control voltage to the gate of the first gain control field effect transistor based on the input power signal and the output power signal.

In one embodiment, the input power signal is an analog signal, and the control circuit further includes an analog to digital converter for converting the input power signal to a digital signal.

In one embodiment, the first gain stage is configured to provide constant gain and the last gain stage is configured to provide constant gain.

In one embodiment, the amplifier includes: a fourth gain stage, including a fourth amplifying device; and a second gain control field effect transistor having a gate and a channel, a first end of the channel being a source of the second gain control field effect transistor, and a second end of the channel being a drain of the second gain control field effect transistor, the channel of the second gain control field effect transistor being operatively coupled across: an input terminal of the fourth amplifying device, and an output terminal of the fourth amplifying device.

In one embodiment, the control circuit is further configured to control a gain of the fourth gain stage by providing a second control voltage to the gate of the second gain control field effect transistor based on the input power signal and the output power signal.

In one embodiment, the control circuit is configured to: calculate a present gain as the ratio of: the amount of power of the signal propagating out of the output of the amplifier, and the amount of power of the signal propagating into the input of the amplifier; calculate a gain deficit as the difference between a small signal gain and the present gain; and when the gain deficit exceeds a gain deficit threshold: decrease the gain of the fourth gain stage until: the gain deficit is less than the gain deficit threshold or an amplifier noise figure increase exceeds a noise figure threshold.

In one embodiment, the control circuit is further configured to: when decreasing the gain of the fourth gain stage results in the amplifier noise figure exceeding the noise figure threshold before the gain deficit is less than the gain deficit threshold: decrease the gain of the third gain stage until: the gain deficit is less than the gain deficit threshold or a further amplifier noise figure increase exceeds the noise figure threshold.

In one embodiment, the amplifier includes a listing of small signal gain values for each of a plurality of values of the first control voltage, and for each of a plurality of values of the second control voltage.

In one embodiment, the lookup table further includes an amplifier noise figure value for each of the plurality of values of the first control voltage applied to the gate of the first gain control field effect transistor, and for each of the plurality of values of the second control voltage applied to the gate of the second gain control field effect transistor.

In one embodiment, the third gain stage immediately precedes the fourth gain stage in the cascade.

In one embodiment, the third amplifying device is a field effect transistor, the input terminal of the third amplifying device is a gate of the field effect transistor, and the output terminal of the third amplifying device is a drain of the field effect transistor.

In one embodiment, the third amplifying device is a bipolar junction transistor, the input terminal of the third amplifying device is a base of the bipolar junction transistor, and the output terminal of the third amplifying device is a collector of the bipolar junction transistor.

In one embodiment, the channel of the first gain control field effect transistor has a resistance of less than 100 ohms at a first gate-source voltage, and a resistance of more than 1,000 ohms at a second gate-source voltage.

In one embodiment, the first gate-source voltage is a knee voltage of the first gain control field effect transistor, minus 10% of the difference between the knee voltage of the first gain control field effect transistor and a pinch-off voltage of the first gain control field effect transistor.

In one embodiment, the amplifier includes a matching network connected to the output of the first gain stage.

In one embodiment, the first end of the channel of the first gain control field effect transistor is connected, through a first DC-blocking capacitor, to one of: the input terminal of the third amplifying device, and the output terminal of the third amplifying device, and the second end of the channel of the first gain control field effect transistor is connected, through a second DC-blocking capacitor, to the other of: the input terminal of the third amplifying device, and the output terminal of the third amplifying device.

In one embodiment, at least one of the first end of the channel and the second end of the channel is connected to ground through a resistor.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of an amplifier with automatic gain control provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
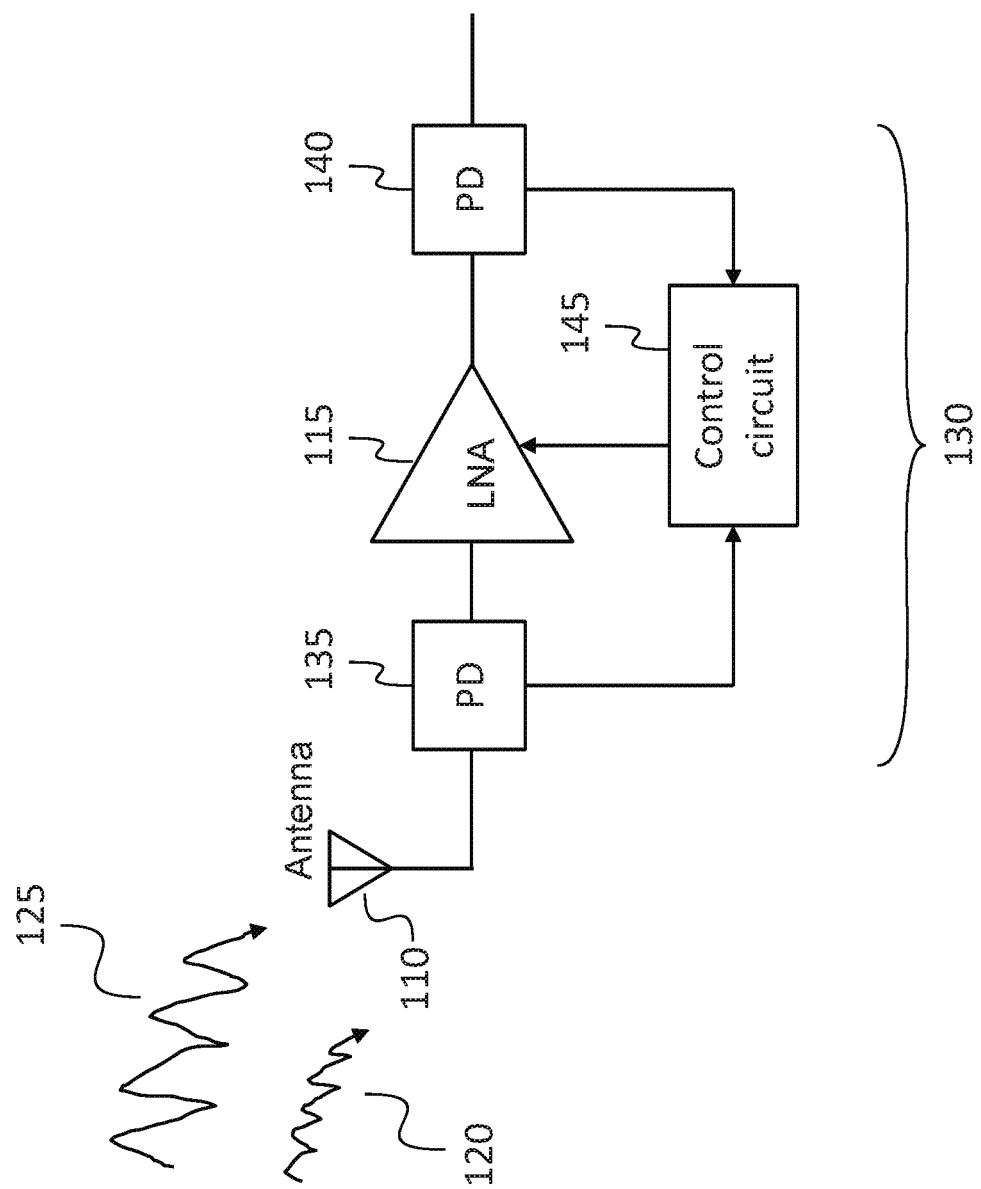
FIG. 1 is a block diagram of an antenna connected to a gain-controlled low noise amplifier, according to an embodiment of the present invention.

Referring to FIG. 1, in one embodiment a radio frequency (RF) or microwave receiver may include a receiving antenna 110 and a low-noise amplifier 115. Signals incident on the antenna may in some circumstances be small amplitude signals 120 and in some circumstances large amplitude signals 125. The large amplitude signals may cause the low-noise amplifier 115 to exhibit nonlinear behavior, e.g., gain compression, and the generation of harmonics and intermodulation products. When the low-noise amplifier 115 for a receiver is selected or designed, gain compression may be avoided by selecting or designing the low-noise amplifier 115 to have relatively low gain. However, such a low-noise amplifier 115 may have noise performance that is inferior to that of an otherwise similar low-noise amplifier 115 having higher gain. The inferior noise performance may impair the system's ability to receive (e.g., to extract information from) small amplitude signals.

As such, it may be advantageous to use a low-noise amplifier 115 that has variable gain, and to set the gain to a high value when the receiver is receiving only small amplitude signals, and to set the gain to a lower value, to avoid gain compression, when the receiver is receiving large amplitude signals. An amplifier system 130 incorporating this capability may include an input power detector 135, an output power detector 140, and a control circuit 145 for receiving signals from the input power detector 135 and the output power detector 140 regarding the input and output signal levels of the low-noise amplifier 115, and for sending one or more control signals to the low-noise amplifier 115, to adjust operating parameters (such as the gain) of the low-noise amplifier 115.

Figure 2A:
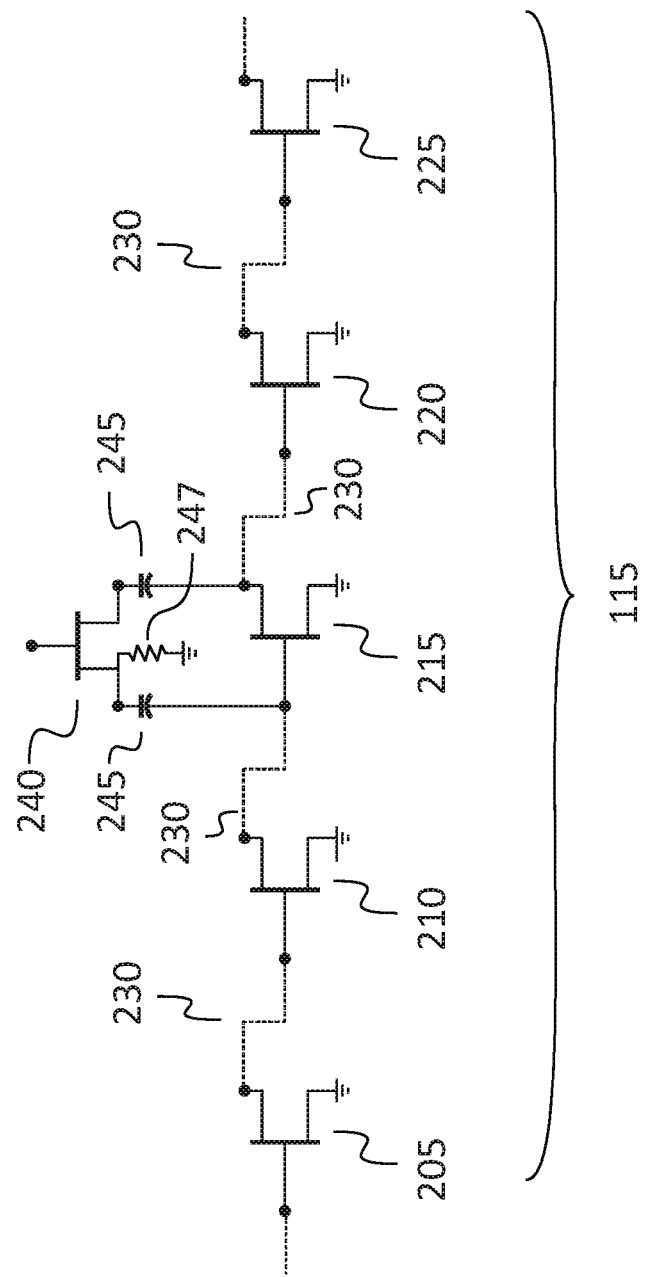
FIG. 2A is a schematic diagram of a low noise amplifier with a gain controlled stage, according to an embodiment of the present invention.

Referring to FIG. 2A, in one embodiment the low-noise amplifier 115 may include a plurality of amplifying field effect transistors 205-225, e.g., a first amplifying field effect transistor 205, a second amplifying field effect transistor 210, a third amplifying field effect transistor 215, a fourth amplifying field effect transistor 220, and a fifth amplifying field effect transistor 225. The amplifying field effect transistors 205-225 may be connected to form a corresponding plurality of cascaded gain stages as shown, each amplifying field effect transistor being connected for example in a common source configuration with the drain of each amplifying field effect transistor (except the fifth amplifying field effect transistor 225) being connected, through a respective matching network 230, to the gate of the subsequent amplifying field effect transistor. The matching networks may be transmission line networks, e.g., microstrip networks or coplanar waveguide networks, formed on a printed wiring board. Each matching network 230 may provide signal transmission from the output of one gain stage to the input of a subsequent gain stage without gain and without significant loss, while providing a different characteristic impedance at the output of the matching network 230 than at the input of the matching network 230.

In some embodiments, a gain control field effect transistor 240 may be connected in a feedback path on one of the amplifying field effect transistors, e.g., in a feedback path of the third amplifying field effect transistor 215 (as illustrated in FIG. 2A). Because the third amplifying field effect transistor 215, connected as a common-source amplifier, may operate as an inverting amplifier, the gain control field effect transistor 240 may provide negative feedback from the output (i.e., the drain) of the third amplifying field effect transistor 215 to the input (i.e., the gate) of the third amplifying field effect transistor 215. The gain control field effect transistor 240 may be controlled with a control voltage applied to the gate of the gain control field effect transistor 240, in a manner to cause the gain control field effect transistor 240 to behave as a continuously adjustable resistance (or a step-wise adjustable resistance, if the gain control field effect transistor 240 is controlled by a voltage adjustable in steps, e.g., from a digital to analog converter). The gain control field effect transistor 240 may exhibit this behavior when it is biased, by the control voltage, to operate in the linear region or "ohmic mode". The gain control field effect transistor 240 may be connected to the third amplifying field effect transistor 215 through two DC-blocking capacitors 245, to prevent the biasing of the gain control field effect transistor 240 and the biasing of the third amplifying field effect transistor 215 from affecting each other. A resistor 247 may connect the source or the drain of the gain control field effect transistor 240 to ground, so that the control voltage applied to the gate of the gain control field effect transistor 240 is the gate-source voltage of the gain control field effect transistor 240. The resistor may be chosen to be sufficiently large, e.g., 20,000 ohms or more, to avoid any significant effect on the signal (e.g., reflection or attenuation of the signal) as a result of RF or microwave signals flowing through the resistor 247.

Figure 2B:
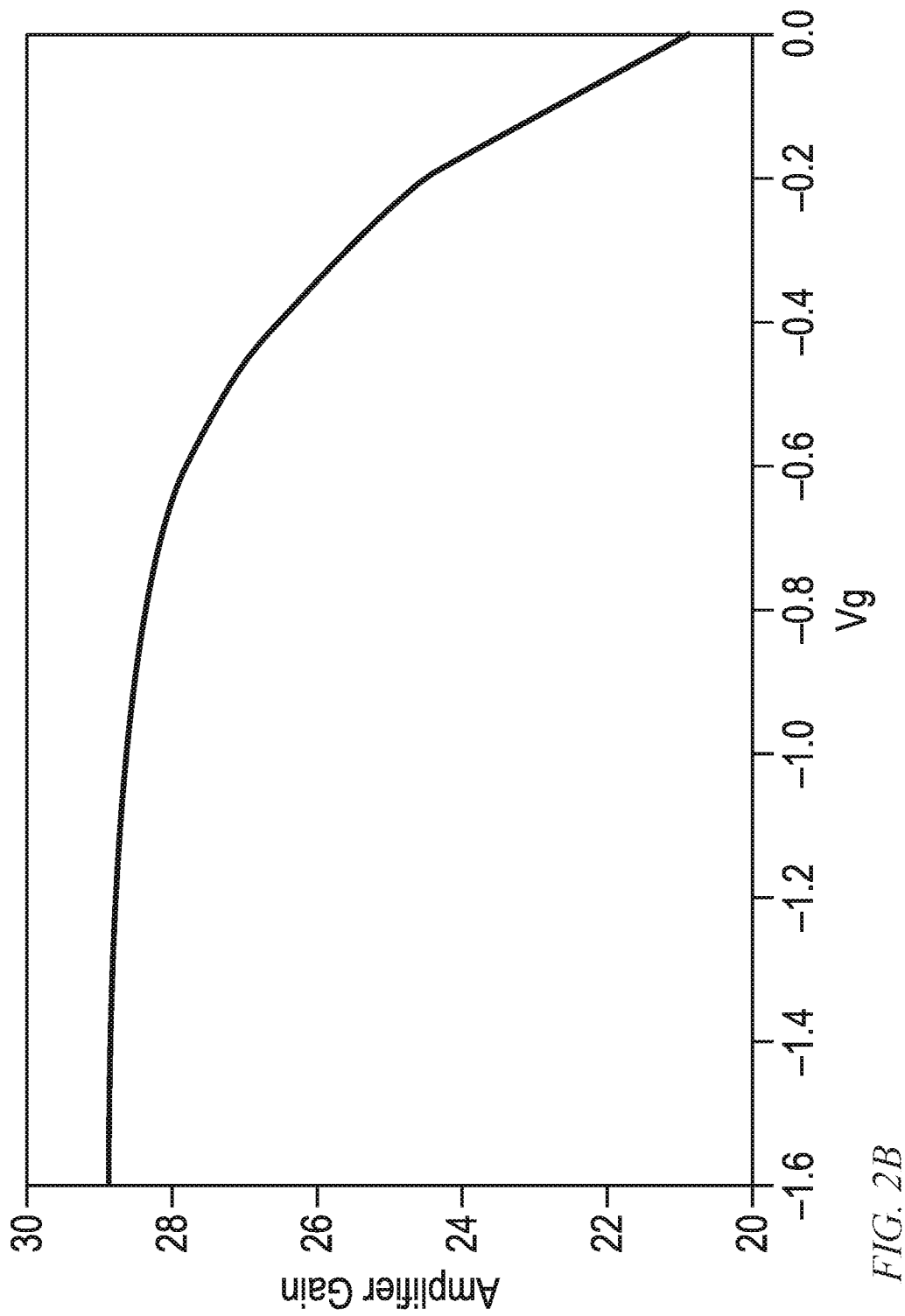
FIG. 2B is a graph of gain as a function of a gate voltage, for the embodiment of FIG. 2A.
Figure 2C:
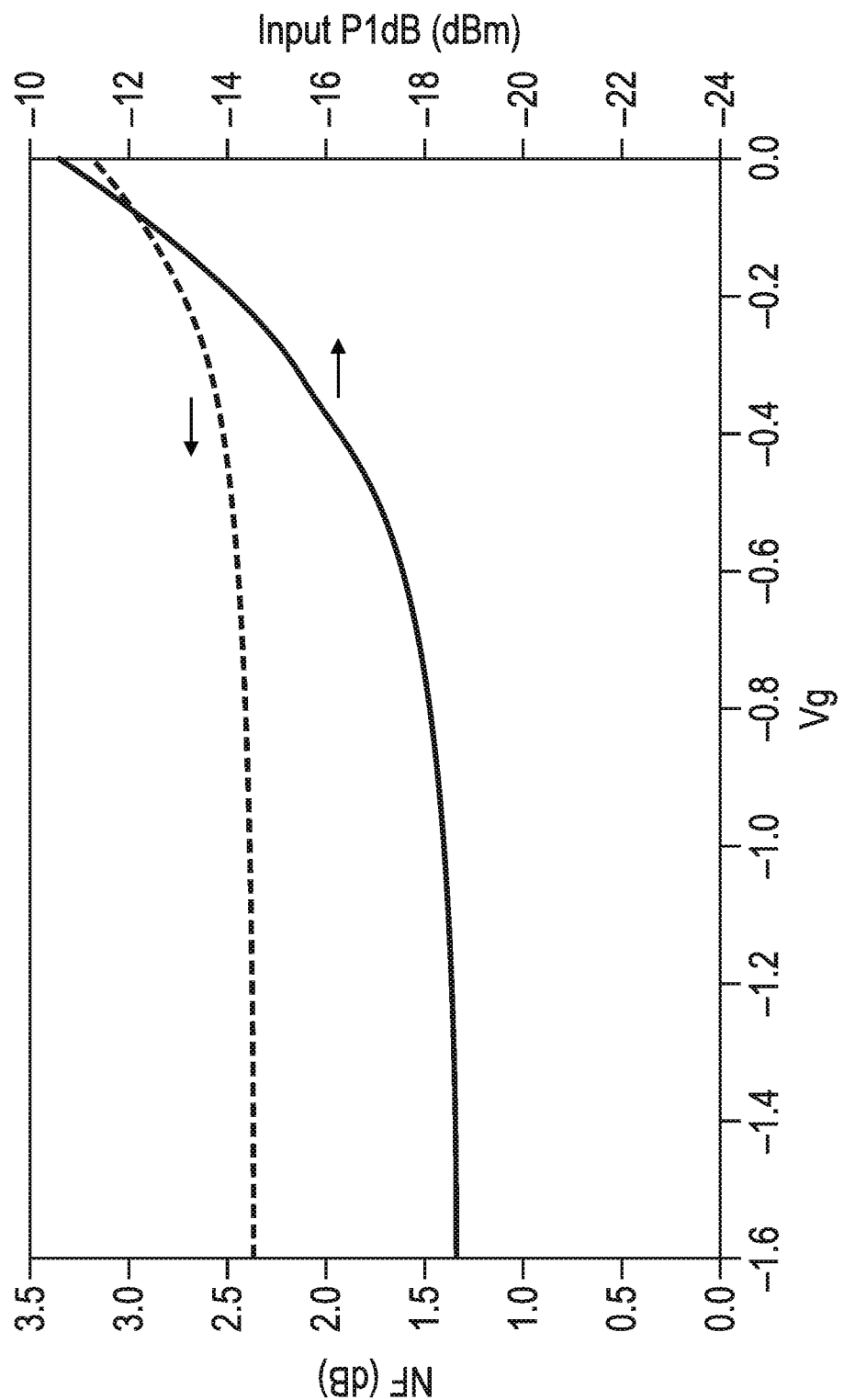
FIG. 2C is a graph of noise figure and of the input power corresponding to 1 dB compression, as a function of a gate voltage, for the embodiment of FIG. 2A.

FIG. 2B shows the simulated gain of the low-noise amplifier 115 of FIG. 2A, as a function of the control voltage (or "gate voltage") Vg. FIG. 2C shows the noise figure (dashed line, and left vertical axis) and the input power at which 1 dB gain compression occurs (solid line, and right vertical axis). As can be seen from FIG. 2C, noise figure may be traded off against linearity by adjusting the control voltage Vg.

Figure 3A:
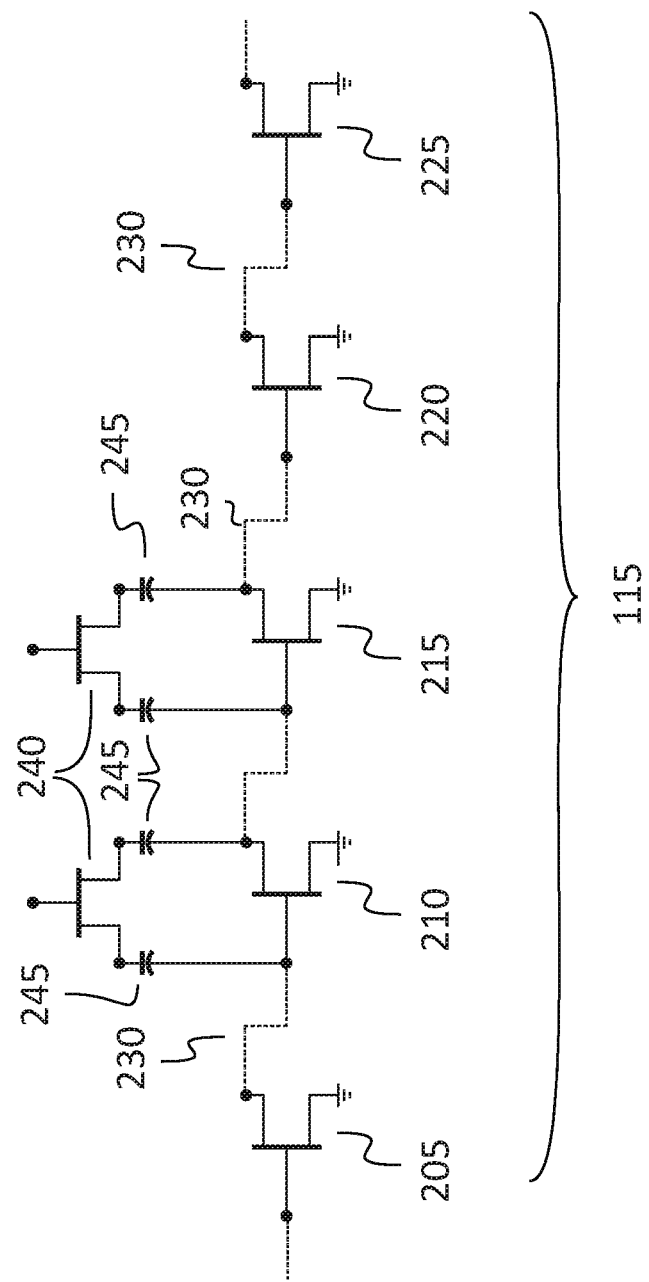
FIG. 3A is a schematic diagram of a low noise amplifier with two gain controlled stages, according to an embodiment of the present invention.
Figure 3B:
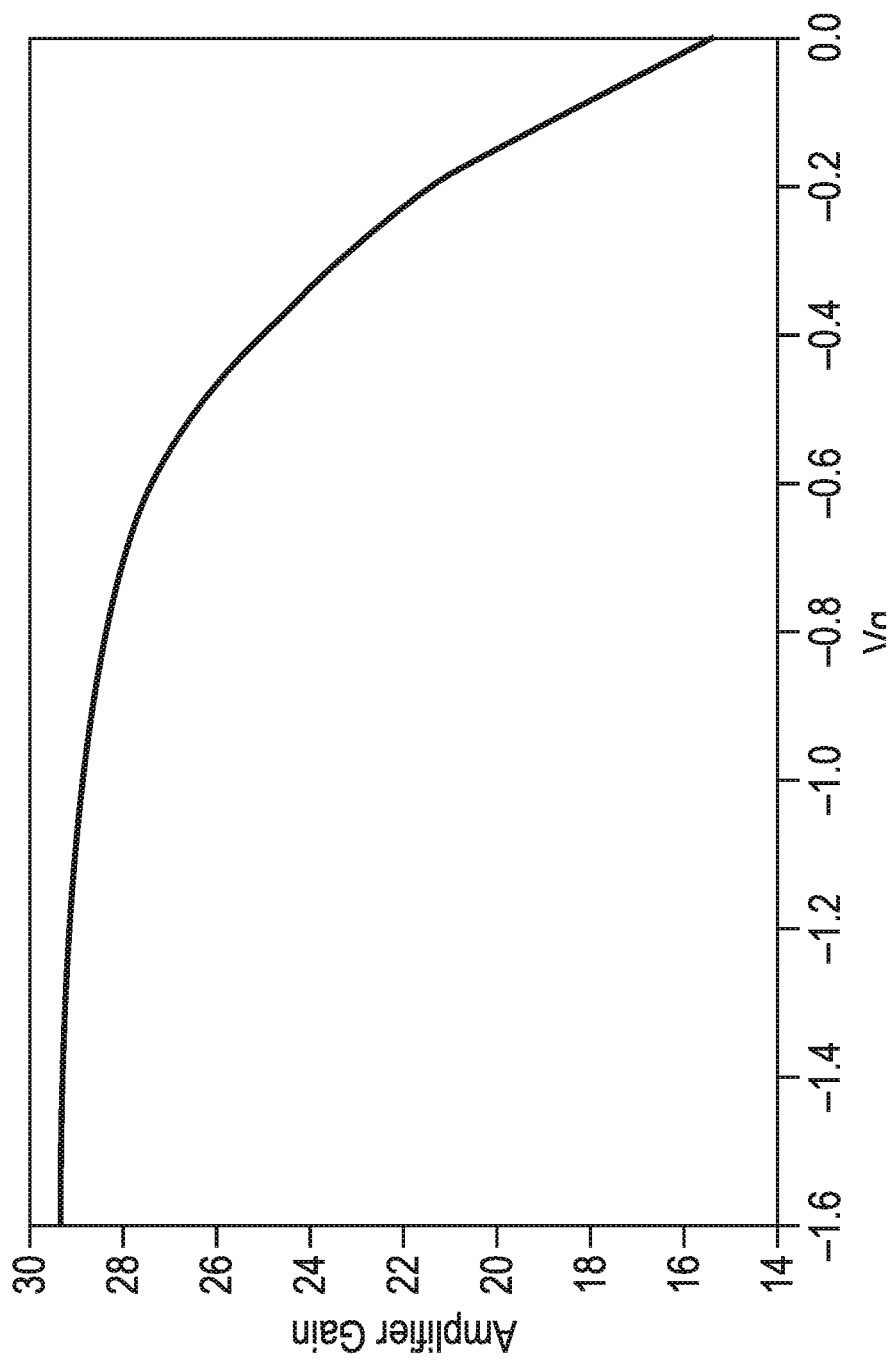
FIG. 3B is a graph of gain as a function of a gate voltage, for the embodiment of FIG. 3A.
Figure 3C:
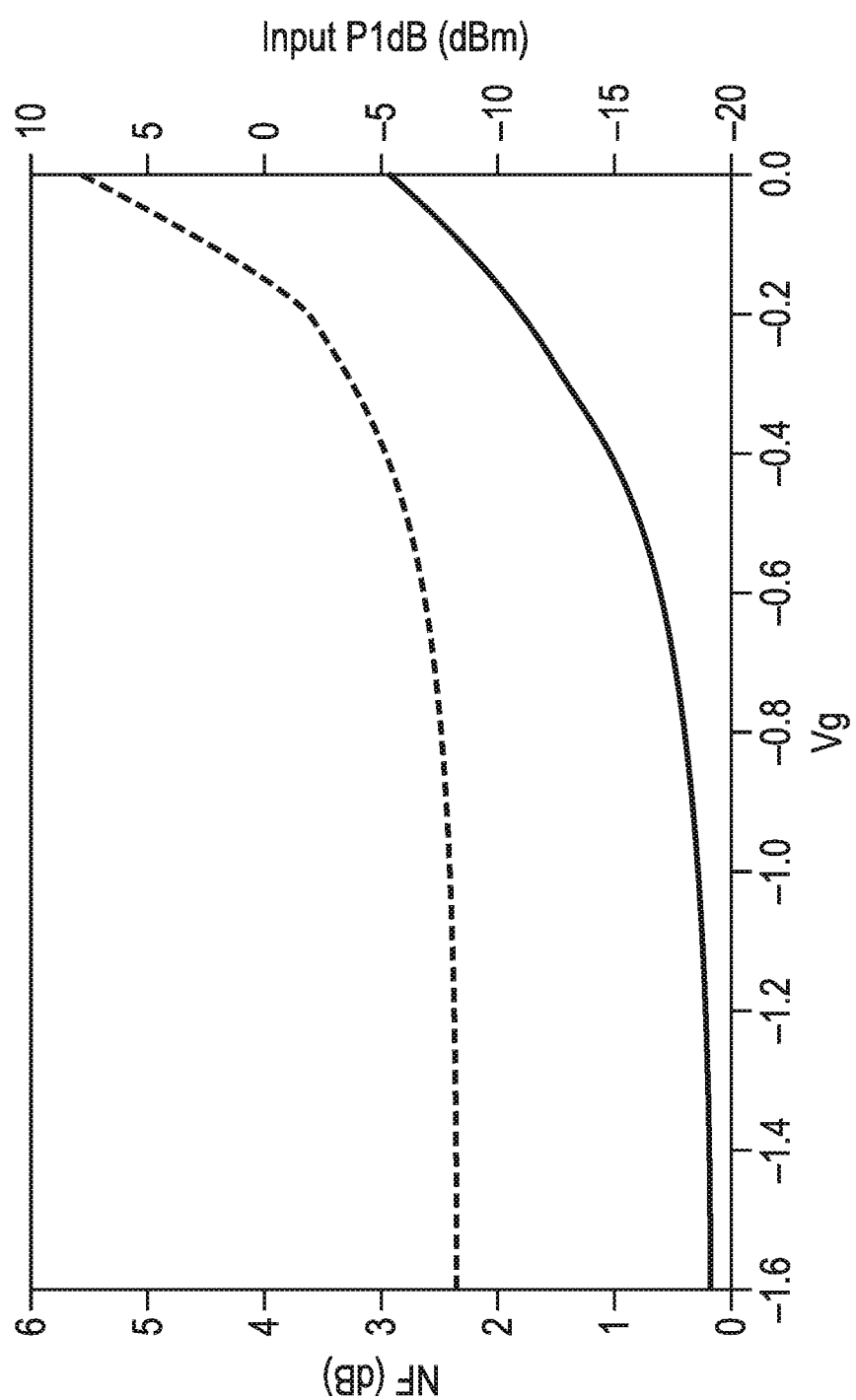
FIG. 3C is a graph of noise figure and of the input power corresponding to 1 dB compression, as a function of a gate voltage, for the embodiment of FIG. 3A.

Referring to FIG. 3A, in one embodiment, two gain control field effect transistors 240 are used to control the gains of two corresponding stages of the low-noise amplifier 115. Each of the gain control field effect transistors 240 is connected to a respective amplifying field effect transistor 210, 215 through a respective pair of DC-blocking capacitors 245. Each of the gain control field effect transistors 240 may have a resistor connected from either the source or the drain to ground (as illustrated for the gain control field effect transistors 240 in the circuit of FIG. 2A; not shown in FIG. 3A). FIG. 3B shows the simulated gain, as a function of the control voltage Vg, of the low-noise amplifier 115 of FIG. 3A, when the same control voltage Vg is applied to both of the gain control field effect transistors 240. FIG. 3C shows the noise figure (dashed line, and left vertical axis) and the input power at which 1 dB gain compression occurs (solid line, and right vertical axis). As can be seen from FIG. 3C, noise figure may be traded off against linearity by adjusting the control voltage Vg, and a broader range of noise figure and linearity characteristics is available than is available for the circuit of FIG. 2A.

Figure 4:
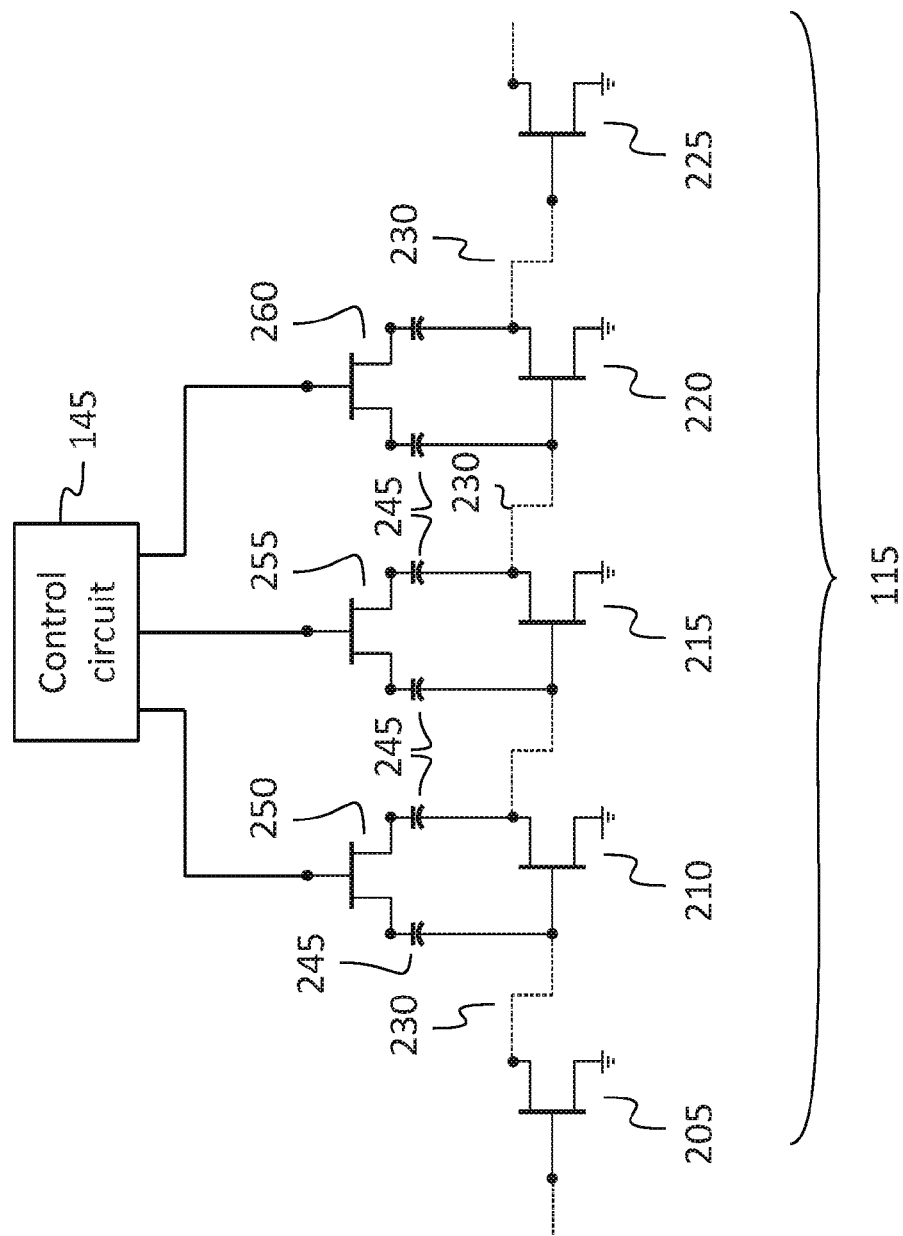
FIG. 4 is a schematic diagram of a low noise amplifier with three gain controlled stages, according to an embodiment of the present invention.

FIG. 4 shows an embodiment in which a first gain control field effect transistor 250 is connected to, and controls the gain of, the second amplifying field effect transistor 210; a second gain control field effect transistor 255 is connected to, and controls the gain of, the third amplifying field effect transistor 215; and a third gain control field effect transistor 260 is connected to, and controls the gain of, the fourth amplifying field effect transistor 220. Each of the gain control field effect transistors 250, 255, 260 is connected to the corresponding amplifying field effect transistor through a respective pair of DC-blocking capacitors 245. Each of the gain control field effect transistors 250, 255, 260 may have a resistor connected from either the source or the drain to ground (as illustrated for the gain control field effect transistors 240 in the circuit of FIG. 2A; not shown in FIG. 4). In the circuit of FIG. 4, the gain control voltages applied to the gain control field effect transistors 250, 255, 260 may all be the same, or they may be different. The gain control voltages may be adjusted according to an algorithm executed in the control circuit.

In one embodiment, the control circuit 145 includes analog to digital converters for converting signals from the input power detector 135 and the output power detector 140 to digital signals, and the control circuit 145 includes a processing unit configured (e.g., programmed) to determine control voltages for each of the gain control field effect transistors 250, 255, 260, depending on the input power and the output power detected by the input power detector 135 and the output power detector 140. The control circuit may further include digital to analog converters to generate the (analog) control voltages, according to digital signals received from the processing unit.

Each of the input power detector 135 and the output power detector 140 may include (i) a directional coupler for diverting a small amount of the signal energy (propagating into the input or out of the output, respectively, of the low-noise amplifier 115) and (ii) a power sensor. The power sensor may include, for example, a Schottky diode biased near the knee or "turn on" voltage, with a current sensing circuit; the current through the Schottky diode may increase with increasing radio frequency or microwave signal power as the diode rectifies the signal. A look up table or other function (e.g., a polynomial approximation) may then be used in the processing unit to infer the power (e.g., in dBm) from the DC current (e.g., in mA) flowing through the Schottky diode in the power sensor.

The processing unit in the control circuit may execute an algorithm to determine appropriate control voltages for each of the gain control field effect transistors 250, 255, 260, and then provide those control voltages, e.g., through the digital to analog converters, the output of each of which may be connected to a gate of a respective one of the gain control field effect transistors 250, 255, 260.

In one embodiment, the algorithm proceeds as follows. The control circuit 145 repeatedly calculates, from the ratio of the output power to the input power, the present gain of the low-noise amplifier 115, and calculates a gain deficit, i.e., the difference between a small signal gain, or "nominal gain" (for the present values of the control voltages) and the present gain. The small signal gain may be a gain for which the amplifier was designed, or a small signal gain the amplifier exhibited during testing. The small signal gain may be tested, for example, in manufacturing, or during a self-test, performed at system startup, in which the system (e.g., a radar system) that contains the amplifier system 130 provides a small signal to the input of the low-noise amplifier 115 and the control circuit measures the small signal gain as the ratio (or as the square root of the ratio) of the output power to the input power. The small signal gain may be a function of the control voltages, and, accordingly may be measured (or calculated or simulated, if a design small signal gain is used) for a range of each of the control voltages.

If the low-noise amplifier 115 is set for maximum gain (i.e., the control voltages are all set to values corresponding to maximum gain) and if the calculated gain deficit is less than a gain deficit threshold (e.g., 1 dB), then the control circuit 145 leaves the control voltages unchanged. Otherwise, the control circuit 145 executes a gain adjustment algorithm.

The gain adjustment algorithm may involve decreasing the gain of the gain controlled stages (i.e., those amplifier stages including a gain control field effect transistor, such as the second, third, and fourth stages of the amplifier of FIG. 4), one stage at a time, starting from the gain controlled stage nearest the output of the low-noise amplifier 115, decreasing each gain within a noise figure constraint, until a linearity requirement is met. For example, if the present gain deficit is 2 dB (e.g., as a result if an increase in the signal power at the input of the low-noise amplifier 115), the gain of the fourth stage (the stage including the third gain control field effect transistor 260 and the fourth amplifying field effect transistor 220) is decreased (by adjusting the control voltage applied to the gate of the third gain control field effect transistor 260) until either (i) the noise figure increases by more than a noise figure threshold (e.g., 0.1 dB) or (ii) the gain deficit falls below the gain deficit threshold.

If the former of these criteria is met first (i.e., the gain of the fourth amplifying field effect transistor 220 has been decreased by the maximum amount possible without unacceptable noise figure degradation), the algorithm leaves the control voltage of the third gain control field effect transistor 260 fixed, and decreases the gain of the third stage (the stage including the second gain control field effect transistor 255 and the third amplifying field effect transistor 215) until either (i) the noise figure of the low-noise amplifier 115 increases by more than a noise figure threshold (e.g., 0.1 dB) or (ii) the gain deficit falls below the gain deficit threshold. This process is repeated for each gain controlled stage of the low-noise amplifier 115 (e.g., for all three gain controlled stages of the circuit of FIG. 4), allowing the overall noise figure to further increase by as much as the noise figure threshold with each additional gain controlled stage that is adjusted. If, when the final gain controlled stage has been adjusted, the gain deficit remains unacceptable, the control circuit may (i) leave the settings at their present values (e.g., allow the low-noise amplifier 115 to operate with gain compression that does not meet system specifications), or (ii) increase the noise figure threshold (to allow a greater gain reduction in each gain controlled stage) and repeat the process of adjusting the gains.

At each step of the gain adjustment process, the present noise figure and small signal gain may be determined from look-up tables generated by simulation (e.g., during the design of the low-noise amplifier 115), or by testing (e.g., by testing during manufacturing, or using a self-test at system startup, as described above). In one embodiment a lookup table is created for each gain controlled stage, including the noise figure and small signal gain for each of a range of control voltages, tabulated at some level of granularity (e.g., voltages ranging from −1.6 V to 0.0 V, in increments of 0.1 V). The gain and noise figure of the low-noise amplifier 115 may then be calculated from the gain and noise figure of each of the gain stages that are not gain controlled and from the gain and noise figure of each gain controlled stage (each looked up on a respective lookup table).

In another embodiment a single lookup table lists the small signal gain and noise figure of the low-noise amplifier 115 for each available combination of control voltages. For example, if each of the three control voltages of the circuit of FIG. 4 can take 17 different values (e.g., voltages ranging from −1.6 V to 0.0 V, in increments of 0.1 V), then the lookup table may have $17^3$, or 4913 rows, corresponding to all combinations of available values of the first control voltage, the second control voltage and the third control voltage. If the analog to digital converters used to generate the control voltages have finer granularity than the lookup table, then interpolation may be used to infer the small signal gain and noise figure of the low-noise amplifier 115 for values of control voltages that are intermediate to values listed in the lookup table.

Figure 5:
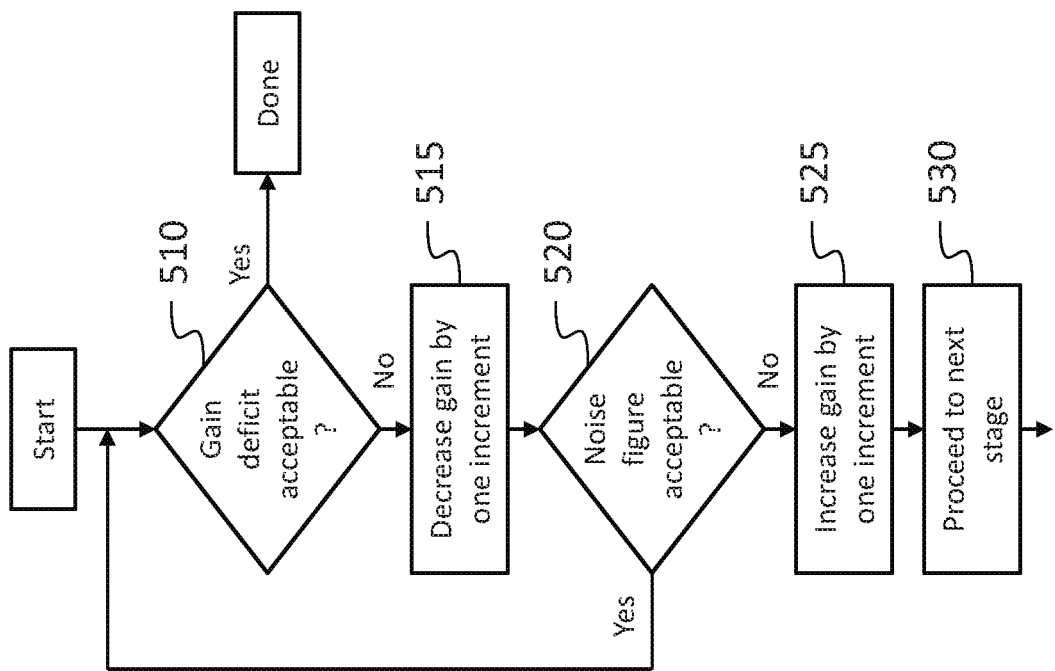
FIG. 5 is a flow chart of a method for adjusting the gain of a gain controlled stage, according to an embodiment of the present invention.

The flow chart of FIG. 5 represents the gain adjustment process for one gain controlled stage, according to one embodiment. The algorithm determines, in an act 510, whether the gain deficit is acceptable; if it is, then the algorithm terminates, having set the control voltages to acceptable values. If gain deficit is not acceptable, the gain is decreased, in an act 520, by a small increment, e.g., an increment corresponding to a 0.1 V increase in the control voltage of the gain control field effect transistor of the gain controlled stage. In an act 520, the algorithm determines whether the noise figure increase due to the gain reduction (i.e., the increase in the noise figure of the low-noise amplifier 115 compared to that when the gain of the gain controlled stage being adjusted is at its maximum value) remains acceptable. If it does, the algorithm returns to act 510; if it does not remain acceptable, the algorithm increases, in an act 525, the gain by one increment (so that the noise figure increase is again acceptable) and proceeds, in an act 530, to adjusting the next gain controlled stage of (i.e., the preceding stage in the cascade of gain stages in) the low-noise amplifier 115.

In some embodiments some or all of the field effect transistors (including the amplifying field effect transistors and the gain control field effect transistors) of the low-noise amplifier 115 are depletion mode field effect transistors, e.g., pseudomorphic high electron mobility transistors (pHEMTs). Each of the gain control field effect transistors may operate in the linear region at a control voltage of 0 V, and may be designed (e.g., with a channel width of between 8 microns and 100 microns) to have a resistance at 0 V of between 50 ohms and 5,000 ohms. In some embodiments, one or more of the gain control field effect transistors is part of a network including resistors, the network being connected between the gate and the drain of the corresponding amplifying field effect transistor. For example, the network may include a resistor connected in series with the gain control field effect transistor and/or a resistor connected in parallel with the gain control field effect transistor.

Each of the gain control field effect transistors may have a knee voltage (e.g. a positive gate voltage of a few tenths of a volt) at which the gate-channel diode junction becomes forward biased, and a pinch-off voltage (e.g., a negative gate voltage of about −1.6 V for a GaAs field effect transistor or a negative gate voltage of about −3.5 V for a GaN field effect transistor). Each of the gain control field effect transistors may be operated with a control voltage ranging from the pinch-off voltage to a voltage slightly less than the knee voltage (e.g., less than the knee voltage by 10% of the difference between the knee voltage and the pinch-off voltage). At the lower end of the range of control voltages, the gain control field effect transistor may have a drain source resistance (e.g., 20,000 ohms) that is large compared to the characteristic impedance of the input or of the output of the gain stage. At the upper end of the range of control voltages, the gain control field effect transistor may have a drain source resistance (e.g., 10 ohms or 100 ohms) that is small compared to, or comparable to, the characteristic impedance of the input or of the output of the gain stage.

In some embodiments the low-noise amplifier 115 has more or fewer than 5 gain stages, and two or more of the gain stages are gain controlled stages. In some embodiments the first and last stages in the low-noise amplifier 115 are not gain controlled but have fixed, or "constant" gain, designed (for the first stage) to provide good noise performance (i.e., low noise figure) and (for the last stage) good linearity. The gain stages of the low-noise amplifier 115 are illustrated for some embodiments as field effect transistors, but the invention is not limited thereto, and in some embodiments the gain stages are constructed with other amplifying devices such as bipolar junction transistors. In such an embodiment a gain control field effect transistor may be connected across an input terminal and an output terminal (e.g., a base and a collector of a bipolar junction transistor) that may correspond to the gate and drain across which the gain control field effect transistor is connected, for example, in FIG. 2A.

The term "processing unit" is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing unit, as used herein, each function is performed either by hardware configured, i.e., hard-wired, to perform that function, or by more general purpose hardware, such as a CPU, configured to execute instructions stored in a non-transitory storage medium. A processing unit may be fabricated on a single printed wiring board (PWB) or distributed over several interconnected PWBs. A processing unit may contain other processing units; for example a processing unit may include two processing units, an FPGA and a CPU, interconnected on a PWB.

Although limited embodiments of an amplifier with automatic gain control have been specifically described and illustrated herein, many modifications and variations will be apparent to those skilled in the art. Accordingly, it is to be understood that an amplifier with automatic gain control employed according to principles of this invention may be embodied other than as specifically described herein. The invention is also defined in the following claims, and equivalents thereof.

What is claimed is:

1. An amplifier having an input and an output, the amplifier comprising:
a plurality of gain stages, connected in a cascade, the plurality of gain stages comprising:
a first gain stage, being the first gain stage in the cascade, and comprising a first amplifying device,
a second gain stage, being the last gain stage in the cascade, and comprising a second amplifying device,
a third gain stage, comprising a third amplifying device; and
a first gain control field effect transistor having a gate and a channel, a first end of the channel being a source of the first gain control field effect transistor, and a second end of the channel being a drain of the first gain control field effect transistor, the channel of the first gain control field effect transistor being operatively coupled across:
an input terminal of the third amplifying device, and
an output terminal of the third amplifying device the amplifier further comprising:
an input power detector connected to the input of the amplifier and configured to produce an input power signal indicating an amount of power of a signal propagating into the input of the amplifier;
an output power detector connected to the output of the amplifier and configured to produce an output power signal indicating an amount of power of a signal propagating out of the output of the amplifier; and
a control circuit connected to:
the input power detector,
the output power detector, and
the gate of the first gain control field effect transistor,
the control circuit being configured to receive the input power signal and the output power signal and to control a gain of the third gain stage by providing a first control voltage to the gate of the first gain control field effect transistor based on the input power signal and the output power signal.

2. The amplifier of claim 1, wherein the input power signal is an analog signal, and the control circuit further comprises an analog to digital converter for converting the input power signal to a digital signal.

3. The amplifier of claim 2, wherein the first gain stage is configured to provide constant gain and the last gain stage is configured to provide constant gain.

4. The amplifier of claim 3, further comprising:
a fourth gain stage, comprising a fourth amplifying device; and
a second gain control field effect transistor having a gate and a channel, a first end of the channel being a source of the second gain control field effect transistor, and a second end of the channel being a drain of the second gain control field effect transistor,
the channel of the second gain control field effect transistor being operatively coupled across:
an input terminal of the fourth amplifying device, and
an output terminal of the fourth amplifying device.

5. The amplifier of claim 4, wherein the control circuit is further configured to control a gain of the fourth gain stage by providing a second control voltage to the gate of the second gain control field effect transistor based on the input power signal and the output power signal.

6. The amplifier of claim 5, wherein the control circuit is configured to:
calculate a present gain as the ratio of:
the amount of power of the signal propagating out of the output of the amplifier, and
the amount of power of the signal propagating into the input of the amplifier;
calculate a gain deficit as the difference between a small signal gain and the present gain; and
when the gain deficit exceeds a gain deficit threshold:
decrease the gain of the fourth gain stage until:
the gain deficit is less than the gain deficit threshold or
an amplifier noise figure increase exceeds a noise figure threshold.

7. The amplifier of claim 6, wherein the control circuit is further configured to:
when decreasing the gain of the fourth gain stage results in the amplifier noise figure exceeding the noise figure threshold before the gain deficit is less than the gain deficit threshold:
decrease the gain of the third gain stage until:
the gain deficit is less than the gain deficit threshold or
a further amplifier noise figure increase exceeds the noise figure threshold.

8. The amplifier of claim 7, wherein the control circuit is further configured to:
determine the small signal gain from a lookup table comprising a listing of small signal gain values for each of a plurality of values of the first control voltage, and for each of a plurality of values of the second control voltage.

9. The amplifier of claim 8, wherein the lookup table further comprises an amplifier noise figure value for each of the plurality of values of the first control voltage applied to the gate of the first gain control field effect transistor, and for each of the plurality of values of the second control voltage applied to the gate of the second gain control field effect transistor.

10. The amplifier of claim 9, wherein the third gain stage immediately precedes the fourth gain stage in the cascade.

11. The amplifier of claim 1, wherein:
the third amplifying device is a field effect transistor,
the input terminal of the third amplifying device is a gate of the field effect transistor, and
the output terminal of the third amplifying device is a drain of the field effect transistor.

12. The amplifier of claim 1, wherein:
the third amplifying device is a bipolar junction transistor,
the input terminal of the third amplifying device is a base of the bipolar junction transistor, and
the output terminal of the third amplifying device is a collector of the bipolar junction transistor.

13. The amplifier of claim 1, wherein the channel of the first gain control field effect transistor has a resistance of less than 100 ohms at a first gate-source voltage, and a resistance of more than 1,000 ohms at a second gate-source voltage.

14. The amplifier of claim 13, wherein the first gate-source voltage is a knee voltage of the first gain control field effect transistor, minus 10% of the difference between the knee voltage of the first gain control field effect transistor and a pinch-off voltage of the first gain control field effect transistor.

15. The amplifier of claim 1, further comprising a matching network connected to the output of the first gain stage.

16. The amplifier of claim 1, wherein:
the first end of the channel of the first gain control field effect transistor is connected, through a first DC-blocking capacitor, to one of:
the input terminal of the third amplifying device, and
the output terminal of the third amplifying device, and
the second end of the channel of the first gain control field effect transistor is connected, through a second DC-blocking capacitor, to the other of:
the input terminal of the third amplifying device, and
the output terminal of the third amplifying device.

17. The amplifier of claim 1, wherein at least one of the first end of the channel and the second end of the channel is connected to ground through a resistor.

* * * * *